United States Patent [19]

Konian et al.

[11] 4,286,179
[45] Aug. 25, 1981

[54] PUSH PULL SWITCH UTILIZING TWO CURRENT SWITCH CIRCUITS

[75] Inventors: Richard R. Konian, Poughkeepsie; James L. Walsh, Hyde Park, both of N.Y.

[73] Assignee: International Business Machines Corporation, Armonk, N.Y.

[21] Appl. No.: 955,551

[22] Filed: Oct. 27, 1978

[51] Int. Cl.³ .......................................... H03K 19/086
[52] U.S. Cl. .................................... 307/455; 307/270; 307/297
[58] Field of Search .............. 307/297, 254, 270, 362, 307/214; 330/255, 262

[56] References Cited

U.S. PATENT DOCUMENTS

| | | | |
|---|---|---|---|
| 3,505,539 | 4/1970 | Pleshko | 307/254 |
| 3,523,194 | 8/1970 | Sheng . | |
| 3,778,640 | 12/1973 | Platt et al. | 307/254 |
| 4,032,801 | 6/1977 | Fulkerson | 307/362 |

*Primary Examiner*—Larry N. Anagnos
*Assistant Examiner*—B. P. Davis
*Attorney, Agent, or Firm*—James M. Thomson; James M. McBride

[57] ABSTRACT

A high speed current switch logic circuit wherein a first and a second transistor are operated in a current switching mode and wherein a third and a fourth transistor are provided whereby the current switching operation of the first and second transistor causes current switching operation of the third and fourth transistors and push pull switching of power to a load.

5 Claims, 1 Drawing Figure

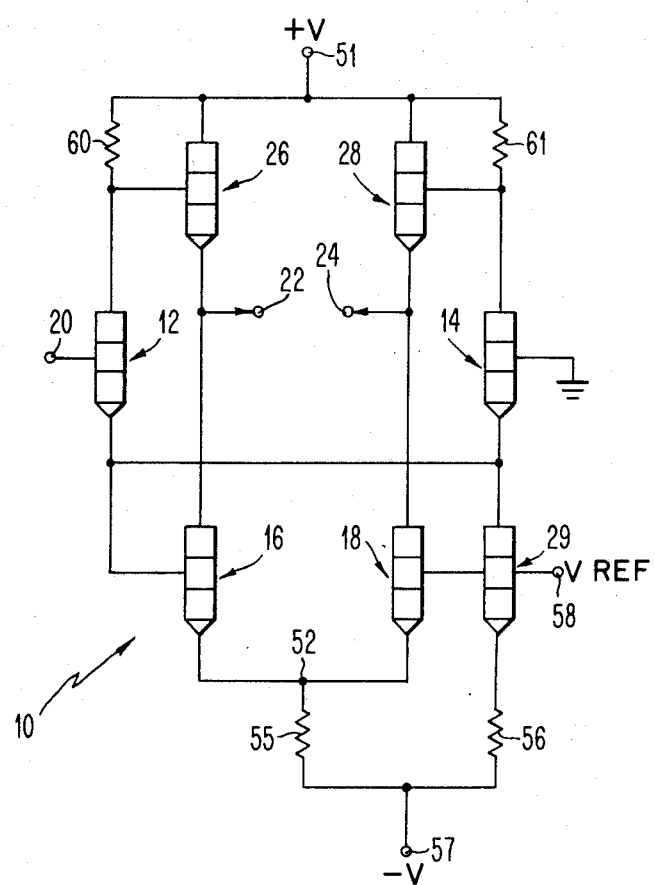

PUSH PULL SWITCH UTILIZING TWO CURRENT SWITCH CIRCUITS

TECHNICAL FIELD

The present invention relates to current switch circuits. More particularly, the invention comprises a push pull switch utilizing two current switch circuits.

It is an object of the invention to provide an improved switching circuit utilizing two current switch circuits which cooperate to form a fast push pull switch.

It is another object of the invention to provide an improved current switching arrangement adapted for push pull operation.

It is yet a further object of the invention to provide a current switch circuit which provides superior performance compared to standard current switch circuits and has good logic capability.

BACKGROUND ART

This invention relates to switching circuits for performing logic functions in digital computers and other LSI applications where binary switches are required. The capability of digital computers and other logic systems employing switching circuits is largely dependent upon the switching speed of the circuits. This is particularly true in view of the enormous number of switching operations which must be performed within a given time period for successful computation or data processing. Consequently, the prior art in logic circuitry emphasizes the development of circuits having high switching speeds.

One high speed switching circuit is disclosed in U.S. Pat. No. 2,964,652 to H. S. Yourke. This patent describes a basic current switch which has been utilized widely in the art in view of its high switching speed capability.

Various improvements have been made upon the basic current switch configuration in order to improve performance for particular applications. For example, U.S. Pat. Nos. 3,509,363; 3,757,138; and 3,509,362 all describe current switching circuits of different configurations.

A need still exists in the prior art, however, for an improved current switching configuration which will lend higher speed and good logic capability with lower power requirements.

BRIEF DESCRIPTION OF THE DRAWINGS

Features and advantages of the invention will become apparent hereinafter from the following detailed description of the invention taken in conjunction with the accompanying drawing wherein, the FIGURE illustrates a schematic representation of a circuit comprising the preferred embodiment of the invention.

DISCLOSURE OF THE INVENTION

Referring now to the drawing an improved push pull switch is illustrated including two current switch circuits. In particular, the switch 10 includes a first current switch circuit including NPN transistors 12, 14 and a second current switch circuit comprising NPN transistors 16, 18 interconnected between an input node 20 and output nodes 22, 24 in an arrangement which permits push pull switching operation.

The specific circuit connections in the FIGURE further include a node 51 which is connected to a positive power source, not illustrated. A conductor connects node 51 with the collector of an emitter follower transistor 26 in the left-hand path of the second current switch. The emitter of transistor 26 is connected to output node 22 and to the collector of transistor 16. The emitter of transistor 16 is connected to a node 52 which is common to the emitter of transistor 18 in well known fashion. Node 52 is also electrically connected to one end of a resistor 55 which has its other end electrically connected to a node 57 adapted to be connected to a negative power source, not illustrated.

In similar fashion node 51 is connected to the collector of an emitter follower transistor 28 having its emitter connected to output node 24 and to the collector of transistor 18. Node 51 is also electrically connected to one end of a resistor 60 having its other end connected to the collector of transistor 12 and to the base of transistor 26. The emitter of transistor 12 is directly connected to the emitter of transistor 14, again in well-known fashion, and the emitter of transistor 12 is likewise connected to the base of transistor 16.

On the other side of the FIGURE a conductor connects node 51 to one end of a resistor 61 having its other end connected to the base of transistor 28 and to the collector of transistor 14. The base of transistor 14 is grounded and the emitter of transistor 14 is connected to the collector of a transistor 29 which acts as a voltage reference. The base of transistor 29 is connected to the base of transistor 18 and to a node 58 which is adapted to be connected to a negative voltage source acting as a reference. The emitter of transistor 29 is connected to one end of a resistor 56 which has its other end connected to node 57.

In the operation of the circuit when input node 20 receives a positive signal, transistor 12 turns on and transistor 14 turns off in conventional current switching operation. When transistor 12 conducts the input to the base of emitter follower 26 becomes more negative and the emitter follower resistor cuts off. Meanwhile because transistor 14 becomes nonconductive the input to emitter follower transistor 28 rises and current flows to the load from the emitter of transistor 28.

At the same time, when transistor 12 turns on transistor 16 also turns on and transistor 18 turns off in current switch operation. Consequently, current now flows from the load into transistor 16 thus completing the push pull action.

When the input to transistor 12 becomes negative the circuit behaves in the opposite fashion. Thus, transistors 12 and 16 are driven to cutoff and transistors 14 and 18 are driven to conduction. Transistor 26 now conducts and provides current to the load and transistor 28 shuts off eventually whereby current is drawn from the load into the collector of transistor 18.

The circuit described provides high speed switching performance when compared to regular current switching circuits, and maintains good logic capability. The performance improvement is constant for all loads and is believed to be recognized because the signal that activates transistors 16, 18 is available at the base of those transistors at almost the same time as the input signal is applied to node 20. This input signal is driven by two emitter followers in cascade (one emitter follower being the input to transistor 12). This lowers the base input impedance and improves circuit speed.

Another advantage results from the use of two current switches. Thus, on the positive going transition of an input signal transistor 18 (which in effect replaces the resistor of a conventional current switch emitter follower) shuts off and remains off. Therefore the entire current supplied by the emitter follower is used to charge the line and base loads.

On the other hand, during the negative transition, the transistor is switched on and therefore acts as a current sink. Consequently, the line and base loads are not discharged through the impedance of a resistor. This in turn enhances the speed of the circuit.

These advantages are believed to offset an increased component count in the circuit and make it competitive for use in high speed switching applications.

There is a possible tendancy for negative overshoot to occur at the collector of transistor 12 due to the input capacitance at the base of transistor 16. If desired, a Schottky barrier diode can be interconnected in parallel with resistor 60 to clamp the voltage at the point and eliminate such overshoot.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A high speed current switch logic circuit comprising:
   first and second transistors having common emitter connections connected by a circuit means to a negative voltage source and means connecting both collectors to a positive voltage source;
   said circuit means including a third transistor connected between the emitter connection of said first and second transistors and said negative voltage source, said third transistor having its base connected to a voltage reference,
   an input connected to the base of the first transistor and means referencing the base of the second transistor whereby said first and second transistors are operated in a current switching mode;
   means for connecting the emitters of fourth and fifth transistors to said negative voltage source and means connecting the collectors to said positive voltage source and to opposite sides of a load; and
   means connecting the emitter of the first transistor to the base of the fourth transistor and means connecting the base of the fifth transistor to said voltage reference whereby current switching operation of the first and second transistors causes current switching operation of the fourth and fifth transistors, as well as push pull switching of power through said load.

2. The circuit of claim 1 wherein the means connecting the collectors of the fourth and fifth transistors to said positive voltage source comprises:
   sixth and seventh emitter follower transistors connected respectively in the collector paths of said fourth and fifth transistors between said positive voltage source and said load.

3. The circuit of claim 2 wherein said transistors are all of NPN type.

4. The circuit of claim 3 wherein the means connecting both collectors of said first and second transistors to said positive voltage source comprises:
   resistors connected respectively between the collectors of said first and second transistors and said positive voltage source, and
   wherein the means for connecting the emitters of the fourth and fifth transistors to said negative voltage source comprises:
   a resistor connected between the common emitter junction of said fourth and fifth transistors and said negative voltage source.

5. The circuit of claim 2 wherein said transistors are of PNP type and wherein said positive voltage source is changed to a negative voltage source and said negative voltage source is changed to a positive voltage source.

* * * * *